United States Patent
Liu et al.

(10) Patent No.: US 9,490,791 B2
(45) Date of Patent: Nov. 8, 2016

(54) METHOD AND CIRCUIT FOR DETECTING USB 3.0 LFPS SIGNAL

(71) Applicant: Advanced Micro Devices, Inc., Sunnyvale, CA (US)

(72) Inventors: Xin Liu, El Dorado Hills, CA (US); Hai Nguyen, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 597 days.

(21) Appl. No.: 14/013,634

(22) Filed: Aug. 29, 2013

(65) Prior Publication Data

US 2015/0067209 A1   Mar. 5, 2015

(51) Int. Cl.
  *G06F 13/42*   (2006.01)
  *H03K 5/22*   (2006.01)
  *H03K 5/156*   (2006.01)
  *H03K 5/24*   (2006.01)

(52) U.S. Cl.
  CPC ............... *H03K 5/22* (2013.01); *H03K 5/156* (2013.01); *H03K 5/2481* (2013.01)

(58) Field of Classification Search
  CPC .......... H03F 2203/45136; H03F 2203/45138; G06F 13/385; G06F 13/38; G06F 13/4072
  USPC ............... 710/106, 100, 105, 104, 305–306; 375/260
  See application file for complete search history.

(56) References Cited

U.S. PATENT DOCUMENTS

| | | | |
|---|---|---|---|
| 3,992,634 A * | 11/1976 | Larson | H03K 17/962 200/600 |
| 6,889,262 B1 | 5/2005 | Gulick | |
| 7,506,077 B2 | 3/2009 | Hesse | |
| 8,180,947 B2 | 5/2012 | Hesse et al. | |
| 8,432,981 B1* | 4/2013 | An | H04K 3/22 375/260 |
| 2003/0177297 A1 | 9/2003 | Hesse et al. | |
| 2013/0307525 A1* | 11/2013 | Chen | G01R 17/10 324/101 |

* cited by examiner

*Primary Examiner* — Tim T Vo
*Assistant Examiner* — Kim T. Huynh
(74) *Attorney, Agent, or Firm* — Rory D. Rankin; Meyertons, Hood, Kivlin, Kowert & Goetzel, P.C.

(57) ABSTRACT

A system and method for efficient detection of Low Frequency Periodic Signaling (LFPS) input signals. A receiver receives two input differential signals that are LFPS input signals. The receiver increases the common-mode voltage for each of the two input differential signals and determines two polarity opposite differences between the level shifted intermediate differential signals. The differences are used to generate two series of relatively narrow pulses by comparisons with a given threshold. A wide continuous pulse is asserted when an initial pulse among the two series of pulses is detected. The wide continuous pulse is deasserted when a final pulse among the two series of pulses is detected. While the wide continuous pulse is asserted, control logic is awakened and performs a Universal Serial Bus (USB) protocol for processing data on the input differential signals.

20 Claims, 4 Drawing Sheets

METHOD AND CIRCUIT FOR DETECTING USB 3.0 LFPS SIGNAL

BACKGROUND

1. Technical Field

This disclosure relates to electronic circuits, and more particularly, to efficient detection of input signals.

2. Background

Modern interfaces allow for plug-and-play connection between devices and computing devices. These interfaces allow devices, such as computer peripherals, portable storage devices, and audio/video (A/V) media players, to connect to a host-computing device for relatively easy data transfer. The computing device may be embodied in a traditional personal computer (desktop or notebook), mobile device (tablet, smart phone, e-reader), entertainment device (smart TV), or embedded in a larger system (e.g., a kiosk, vehicle, etc.) The connection and disconnection may occur without rebooting the computing device or turning off the device. Several devices may be simultaneously used without requiring manufacturer-specific device drivers to be installed on the host-computing device.

One example of the above interface is the Universal Serial Bus (USB), which is a standard serial bus interface for connecting devices. The USB Implementers Forum (USB-IF), an industry trade association incorporating companies from the computer and electronics industries, standardizes the design of USB. USB is intended to replace many legacy varieties of serial and parallel ports. Each developed version of the specification increases the data transmission rate and provides downward compatibility to older versions.

A high-speed USB interface utilizes a sideband of communication for managing signal initiation and low power management on the bus on a link between two ports. This sideband is referred to as Low Frequency Periodic Signaling (LFPS). LFPS employs a predetermined frequency range to communicate the initialization and power management information. For example, the third version or generation of the USB interface, the USB 3.0 interface, utilizes LFPS, whereas the previous two versions do not utilize LFPS. To ensure the proper operation of a high-speed interface using the USB 3.0 specification, a receiver must correctly detect high-speed data rates, such as rates of 5-Gigabits-per-second (Gb/s) or 2.5 Gigahertz (GHz). Additionally, to reduce the cost of power management, the receiver may include a LFPS detector for detecting low-speed LFPS signals with a data rate of 10 MHz to 50 MHz in a low-power 3.0 link.

In view of the above, systems and methods for efficient detection of input signals are desired.

SUMMARY OF EMBODIMENTS

Systems and methods for efficient detection of input signals are contemplated. In various embodiments, a data communications system includes a transmitter coupled to a receiver via two data lines for a USB interface. The data communication system may utilize a high-speed Universal Serial Bus (USB) 3.0 specification. Each of the two input differential signals may be a Low Frequency Periodic Signaling (LFPS) input signal. The receiver may include a level shift stage that raises or increases the common-mode voltage for each of the two input differential signals. Differences between the received two input differential signals may be found by determining differences between the level shifted intermediate signals. Differences between the level shifted intermediate differential signals may be determined for each phase or half cycle. For example, a first difference may be determined between a first intermediate signal and a second intermediate signal. A second difference may be determined with reverse polarity, such as between the second intermediate signal and the first intermediate signal. The two differences may be compared to a given threshold, such as a built-in threshold voltage of a comparator circuit.

When either of the two differences exceeds the given threshold, a respective pulse may be generated while a given difference of the two differences is above the given threshold. A first series of pulses may be generated, wherein each pulse in the first series is generated while the first difference exceeds the given threshold. Similarly, a second series of pulses may be generated, wherein each pulse in the second series is generated while the second difference exceeds the given threshold. The two series of narrow pulses may be converted to a wide continuous pulse without any gaps. While the wide continuous pulse is detected, control logic within the receiver may be awakened or receive an indication to exit a sleep mode. Afterward, the control logic begins performing a protocol for processing data on the input differential signals. The protocol may include the high-speed USB 3.0 specification.

These and other embodiments will be further appreciated upon reference to the following description and drawings.

While the embodiments are susceptible to various modifications and alternative forms, specific embodiments are shown by way of example in the drawings and are herein described in detail. It should be understood, however, that drawings and detailed description thereto are not intended to limit the embodiments to the particular form disclosed, but on the contrary, the embodiments are to cover all modifications, equivalents and alternatives falling within the spirit and scope of the embodiments as defined by the appended claims.

DETAILED DESCRIPTION OF EMBODIMENT(S)

In the following description, numerous specific details are set forth to provide a thorough understanding of the embodiments. However, one having ordinary skill in the art should recognize that the embodiments might be practiced without these specific details. In some instances, well-known circuits, structures, and techniques have not been shown in detail to avoid obscuring the embodiments.

Figure 1:
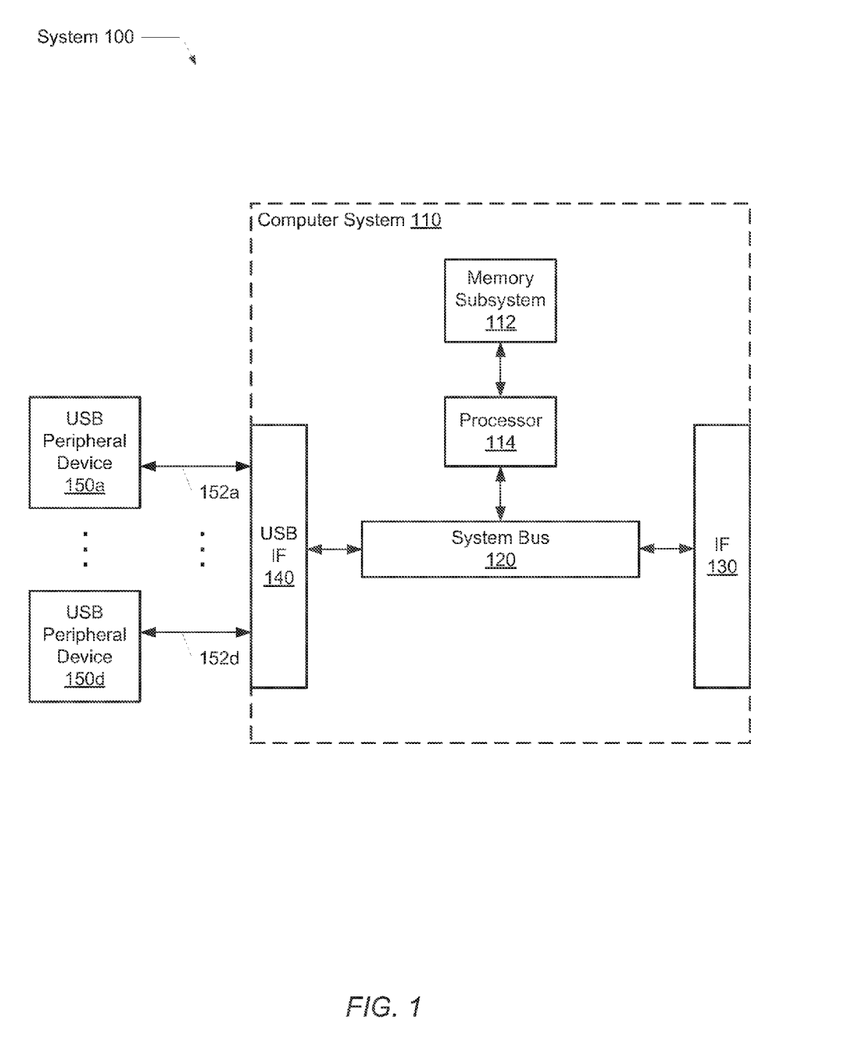
FIG. 1 is a generalized block diagram of one embodiment of a computing system.

Referring to FIG. 1, one embodiment of a computing system 100 is shown. As shown, one or more Universal Serial Bus (USB) peripheral devices 150*a*-150*d* are coupled to a computer system 110. Buses 152*a*-152*d* and USB interface 140 may be used to couple the USB peripheral devices to the computer system 110. In various embodiments, the computer system 110 includes a system bus 120, a processor 114, and a memory subsystem 112. Additionally, the computer system may include the USB interface 140 and the interface 130 for connecting to other input/output (I/O) peripheral devices and to other systems. Although a single processor 114 is shown, the computer system 110 may include multiple processors, each with one or more processor cores. The multiple processors may be homogenous or heterogeneous microarchitecture designs.

The computer system 110 may include one of various computing products such as a desktop computer, a tablet computer, a smart phone, a laptop computer, an automotive information, navigation, or entertainment system; and so forth. For ease of illustration, the system 100 does not include all examples of functional blocks, control logic, and interfaces required both within and outside the computer system 110. Based on the design and capability of the computer system 110, the USB peripheral devices 150a-150d may include portable storage devices, game pads, smart phones, personal data assistants (PDAs), portable audio/video players, cameras, and so forth.

Each one of the USB peripheral devices 150a-150d may include several logical sub-devices to provide several functions. For example, a portable digital versatile disc (DVD) player has both a video device function and built-in speakers, which is an audio device function. Other USB peripheral devices are contemplated to also be within the scope of the present disclosure. The specific type of USB peripheral device used does not limit the disclosure. Each one of the buses 152a-152d may include one of a USB cable, printed circuit board (PCB) traces, or another electrical physical connection. The USB interface 140, the buses 152a-152d, and the USB peripheral devices 150a-150d may utilize serial data communications for easy transfer of data by means of hot swapping. One example of serial data communications is the Universal Serial Bus (USB) standard serial bus interface for connecting devices.

Generally speaking, the USB specification is a master/slave architecture. From the frame of reference of a USB interface, the master is referred to as the "upstream" device, or host/hub. The slave is referred to as the "downstream" device. The USB interface consists of four wires: D+, D−, VBUS, and Ground. The two data lines, D+ and D−, are for bi-directional data transfer and use differential drive techniques. The wires VBUS and Ground are used to distribute power from the upstream host to the downstream device. Again, the terms "upstream" and "downstream" are from the point-of-view of a particular USB interface.

In various embodiments, each one of the USB interface 140, the buses 152a-152d, and the USB peripheral devices 150a-150d utilize a high-speed USB specification. One example is the specification defined by the high-speed version USB 3.0. Although, the high-speed version USB 3.0 is used as an example, other specifications and data transfer rates are possible and contemplated. Unlike other interface technologies, the high-speed version USB 3.0 uses Low Frequency Periodic Signaling (LFPS) to communicate initialization and power management information.

In order to ensure the proper communication of information among the USB interface 140, the buses 152a-152d, and the USB peripheral devices 150a-150d, the receiver side must correctly detect the LFPS signal coming from a transmitter side of the interface. The receiver side may include multiple stages for both correctly detecting the LFPS signal and conveying correct data to other function blocks for processing the incoming information. Additionally, the receiver side may perform these steps with low power consumption in order to both reduce an amount of power drawn from a surrounding system and reduce an amount of low-power management logic in the surrounding system.

In various embodiments, the multiple stages in the receiver may include a level shift stage, a comparator stage, a pulse conversion stage, and a digital controller stage. The level shift stage may raise the common-mode voltage of the received differential signals to ensure detection of the input signals. Additionally, the raised common mode voltage may assist the comparator stage to determine differences between the received differential signals. Further, the level shift stage may reduce an input capacitative load on the differential input wires. The comparator stage may include two comparators to ensure half cycles on the received differential signals are not missed and inadvertently create gaps on a digital translated signal. Further details are provided later.

In various embodiments, the USB interface 140 includes a USB host comprising multiple downstream USB ports and multiple USB peripheral devices 150a-150d connected in an asymmetric tiered-star topology. The USB peripheral devices 150a-150d and corresponding USB hubs are linked in series built into a host controller within the USB host. Additional USB hubs may be included in the tiers, allowing branching into a tree structure with up to five tier levels. A USB host may have multiple host controllers and each host controller may provide one or more USB ports. A USB host within the USB interface 140 connects a host system, such as the computer system 110, to other network and storage devices, such as the USB peripheral devices 150a-150d.

A host controller interface (HCI) in the USB interface 140 is a register level interface, which allows a host controller within USB host to communicate with an operating system of the computer system 110. On an expansion card or motherboard controller, the HCI may include digital logic engines in Field Programmable Gate Arrays (FPGAs) in addition to analog circuitry to manage the high-speed differential signals. On the software side, the HCI may require a device driver, or a Host Controller Driver (HCD). Two modern versions of HCI include an Open Host Controller Interface (OHCI) and an Enhanced Host Controller Interface (EHCI). They are embedded in the USB host, which routes the differing USB speeds accordingly without user intervention.

Logic within the USB interface 140 may include a physical layer (PHY), which may be integrated into most USB systems in order to provide a bridge between the digital and modulated parts of the interface. A PHY connects a link layer device to a physical medium such as an optical fibre or copper cable. A PHY typically includes a Physical Coding Sublayer (PCS) and a Physical Medium Dependent (PMD) sublayer. The PCS encodes and decodes the data that is transmitted and received. The purpose of the encoding is to make it easier for the receiver to recover the signal. The PMD consists of a transceiver for the physical medium.

In various embodiments, the illustrated functionality of the computer system 110 is incorporated upon a single integrated circuit. In other embodiments, the illustrated functionality of the computer system 110 may be provided on a system-on-chip (SOC), on separate semiconductor chips on a motherboard or card, or other. Although a single processor 114 is shown, the computer system 110 may include multiple processors, each with multiple processor cores. Each processor core includes circuitry for executing instructions according to a predefined instruction set. For example, the x86 instruction set architecture (ISA) may be selected. Alternatively, the Alpha, PowerPC, or any other instruction set architecture may be selected.

Each processor core may be implemented to simultaneously execute multiple software threads of a software application. In another embodiment, the processor 114 includes one or more application specific integrated circuits (ASICs) or microcontrollers. In addition, the processor 114 may include one or more digital signal processors (DSPs), graphic processing units (GPUs), analog-to-digital converters (ADCs), and digital-to-analog converters (DACs). Other data processing semiconductor chip designs are possible and contemplated. Further, physically, these data processing designs may be implemented outside of the computer system 110 for interfacing reasons, on-die routing and signal integrity reasons, or other reasons.

Generally speaking, the processor 114 accesses memory storage for data and instructions or commands. Although not shown, it is possible an ASIC, or other data processing die, may receive a command directly from an outside source via interface (IF) 130. In one embodiment, a cache memory subsystem implemented as a L1 cache structure configured to store blocks of data, and possibly with an additional L2 cache structure, is integrated within computer system 110. Memory subsystem 112 may be implemented as a L2 or L3 cache structure and may be directly coupled to the processor 114. If a requested block is not found in an integrated cache structure or memory subsystem 112, then a read request may be generated and transmitted to a memory controller not shown in order to access outside memory to which the missing block is mapped. The functionality of a memory controller may be included in the interface 130.

Any integrated memory within the processor 114, the memory subsystem 112, and any off-die memory may comprise any suitable memory devices in addition to a cache structure. For example, these memories may comprise one or more RAMBUS dynamic random access memories (DRAMs), synchronous DRAMs (SDRAMs), DRAM, static RAM, sequential storage elements such as flip-flops and latches, etc.

The system bus 120 may be configured to respond to control packets received on links to which the computer system 110 is coupled, to generate control packets in response to the processor 114 and/or memory subsystems 112, to generate probe commands and response packets in response to transactions selected by a memory controller not shown, and to route packets through interface logic 140. The interface (IF) 130 may include logic to receive packets and synchronize the packets to an internal clock used by system bus 120. The interface 130 may include buffers and queues for storing packets to be processed or transmitted. The computer system 110 may employ any suitable flow control mechanism for transmitting data.

Figure 2:
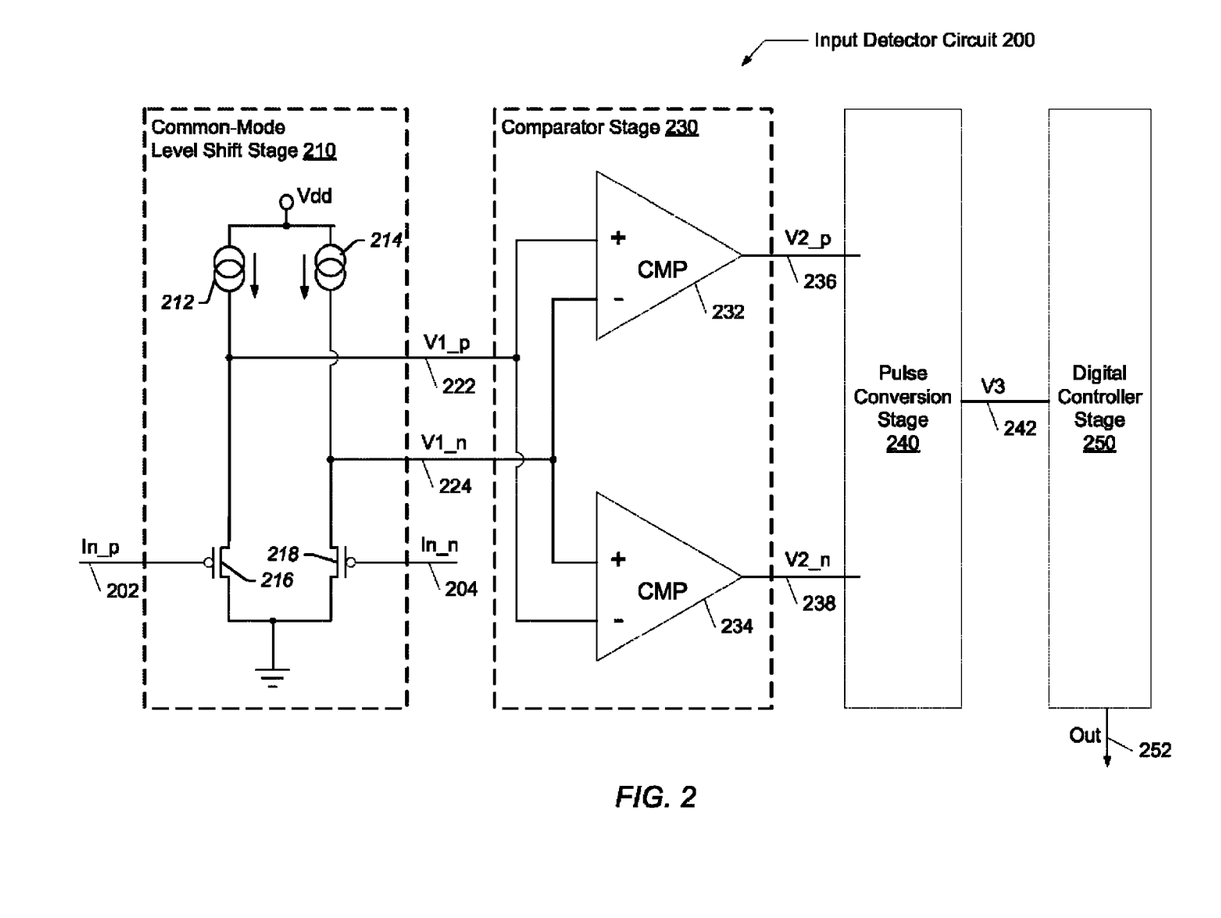
FIG. 2 is a generalized block diagram of one embodiment of an input detector circuit.

Turning now to FIG. 2, one embodiment of an input detector circuit 200 is shown. The input detector circuit 200 may be used within a receiver on a USB interface. The input detector circuit 200 may receive input differential signals In_p 202 and In_n 204 and produce a digital output Out 252. The output signal Out 252 may include a continuous pulse at a logic high value without gaps that coincide with time frames the input differential signals carry information between electrical idle times. The input detector circuit 200 may be used as a Low Frequency Periodic Signaling input detector. Generally, when the amplitude of the input differential signals In_p 202 and In_n 204 is above a given threshold, the input detector circuit 200 detects this condition and wakes up or alerts other receiver circuitry with the digital output signal Out 252. Accompanying signal waveforms are described later.

In various embodiments, the input detector circuit 200 includes a common-mode level shift stage 210, a comparator stage 230, a pulse conversion stage 240, and a digital controller stage 250. The common-mode level shift stage 210 raises the common-mode voltage of the received differential signals In_p 202 and In_n 204 to ensure detection of the input signals. The signals with the raised common-mode voltage are provided as output differential signals V1_p 222 and V1_n 224. The signals V1_p 222 and V1_n 224 may also be referred to as level-shifted signals V1_p 222 and V1_n 224. Alternatively, the signals V1_p 222 and V1_n 224 may also be referred to as intermediate signals V1_p 222 and V1_n 224. The intermediate signals V1_p 222 and V1_n 224 are level-shifted versions of the input differential signals In_p 202 and In_n 204. The intermediate signals V1_p 222 and V1_n 224 are sent to the comparator stage 230.

As described earlier, the high-speed version USB 3.0 is a high-speed serial interface. The high-speed version USB 3.0 transmits data on differential lines at 5 gigabits per second (Gb/s). A receiver on a chip or a device receives a pair of high-speed differential signals on the two data lines, D+ and D−, from a transmitter on another chip or another device. The received differential signals In_p 202 and In_n 204 may arrive on these two data lines. Unlike other interface technologies, the high-speed version USB 3.0 uses Low Frequency Periodic Signaling (LFPS) from 10 megahertz (MHz) to 50 MHz to communicate sideband information such as initialization and power management information. The sideband information may be detected and received by the input detector circuit 200. In various embodiments, there may also be a separate high-speed USB receiver in addition to input detector circuit 200. Interface technologies, such as USB 3.0, may have a relative high-speed data transfer rate in addition to a relative low-speed handshake transfer rate for sideband information. In various embodiments, the separate high-speed USB receiver may be used for the relative high-speed data transfers and the input detector circuit 200 may be used for the relative low-speed data transfers for sideband information. Due to not utilizing a rectifier, the input detector circuit 200 may consume appreciably less power than high-speed USB receivers, SATA (Serial Advanced Technology Attachment) receivers, PCI (Peripheral Component Interconnect) receivers, and so forth.

The maximum rise and fall times of a LFPS signal in this specification may be 4 nanoseconds (ns). The length of a LFPS burst may be in the range of 40 ns to 1.4 microseconds (μs). A LFPS signal may comprise a pulse of alternating logic high and logic low values at a periodic rate of 25 MHz. An electrical idle may occur both at the start and at the end of the pulse. During electrical idle, the data become static, i.e., both the positive and negative interconnect wires are hold at common-mode voltage. Again, an example of accompanying signal waveforms is described later.

The common-mode level shift stage 210 includes two current sources 212 and 214 and two pmos transistors 216 and 218. Current sources 212 and 214 may be implemented by any topology known by those skilled in the art. These current sources may provide predetermined current values to the circuitry below. Each of the transistors 216 and 218 receives an input signal, such as one of the two input differential signals In_p 202 and In_n 204 on D+ and D− data lines, on a gate terminal. Each of the transistors 216 and 218 generates a differential output on a respective source terminal. The generated output signals V1_p 222 and V1_n 224 are sent to the comparator stage 230.

Figure 3:
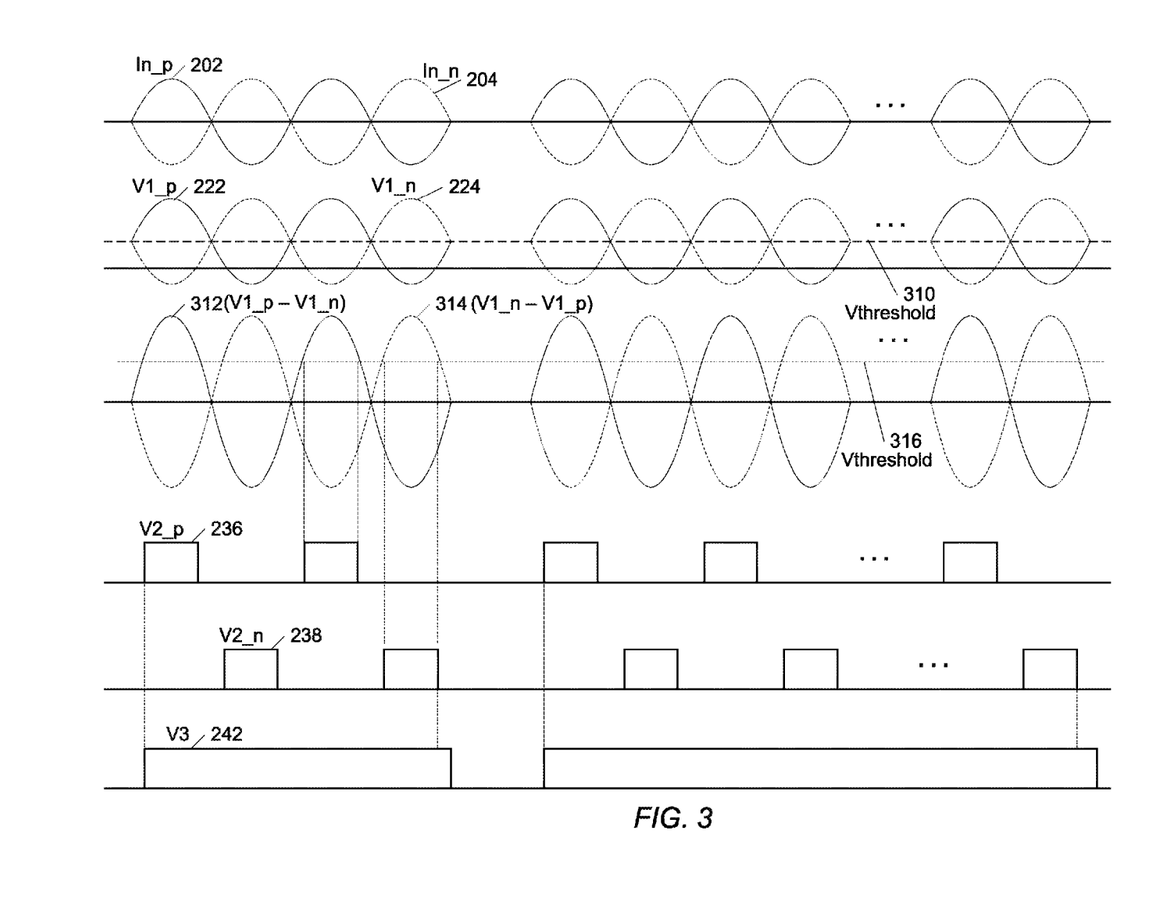
FIG. 3 is a generalized block diagram of one embodiment of signal waveforms.

Before continuing with a description of the input detector circuit 200, accompanying signal waveforms are also described. Turning now to FIG. 3, one embodiment of signal waveforms 300 is shown. The signal waveforms 202-314 may illustrate signal waveforms within the input detector circuit 200. The input differential signals In_p 202 and In_n 204 and the digital output signal V3 242 are numbered identically in both FIG. 2 and FIG. 3. The input detector circuit based on the input differential signals In_p 202 and In_n 204 may produce the digital output signal V3 242.

As shown in FIG. 3, the input differential signals In_p 202 and In_n 204 alternate from an electrical idle to providing two complete cycles of information and returns to an electrical idle. The In_p 202 signal is a complement of the In_n 204 signal. Following the electrical idle, the input differential signals In_p 202 and In_n 204 provide a second pulse of multiple cycles of alternating logic high and logic low values before returning again to the electrical idle state. In the example shown, the input differential signals In_p 202 and In_n 204 have a common-mode voltage of 0V.

Referring again to FIG. 2, in some embodiments, the common-mode level shift stage 210 raises the common-mode voltage of the input differential signals In_p 202 and In_n 204 from 0V to a value approximately equal to the threshold voltage of the pmos transistors 216 and 218. Therefore, the generated output signals V1_p 222 and V1_n 224 have sufficient amplitude to drive the comparator stage 230. Accordingly, if Vtp is the threshold value of the pmos transistors 216 and 218, V1_p 222 equals In_p 202+Vtp and V1_n 224 equals In_n 204+Vtp. In the embodiment shown in FIG. 3, the threshold 310 is used to level shift the received differential signals and produce the level-shifted intermediate signals V1_p 222 and V1_n 224. In various embodiments, the threshold 310 is approximately equal to the threshold value of the pmos transistors 216 and 218, or Vtp. Continuing with the differences between signals, it can be seen that (V1_p 222-V1_n 224) equals (In_p 202-In_n 204). The difference is the same, but the peak amplitudes of the signals sent to the comparator stage 230 are greater with the level shift. Accordingly, the intermediate signals V1_p 222 and V1_n 224 have larger peak amplitudes than the signals In_p 202 and In_n 204. These intermediate signals V1_p 222 and V1_n 224 are input into the comparator stage 230 as shown in FIG. 2. The signal waveforms (V1_p-V1_n) 312 and (V1_n-V1_p) 314 shown in FIG. 3 are signals found by the comparator stage 230 before generating digital pulses.

In the common-mode level shift stage 210, the drain terminals of the transistors 216 and 218 are shorted to a logic low value, such as a ground terminal. Since the common-mode level shift stage 210 uses only two transistors for receiving the differential signals In_p 202 and In_n 204, rather than using four or more transistors, the input capacitative load is reduced for the detector circuit 200. By raising the common-mode voltage and reducing the input capacitative load, the common-mode level shift stage 210 both reduces power consumption and reduces noise introduced to later stages. Alternative receiver detector circuits utilize a rectifier, but these alternative designs also consume an appreciable amount of power.

In some embodiments, the comparator stage 230 includes two comparators 232 and 234. The comparators 232 and 234 may be implemented by any topology known by those skilled in the art. The comparators 232 and 234 may be identical designs. For the first comparator 232, the intermediate signals V1_p 222 and V1_n 224 may be connected to the positive and negative pins, respectively. However, for the second comparator 234, the intermediate signals V1_p 222 and V1_n 224 may be swapped. The signals V1_p 222 and V1_n 224 may be connected to the negative and positive pins, respectively.

Each one of the comparators 232 and 234 has a built-in threshold voltage. Referring again to FIG. 3, this threshold voltage is shown as threshold 316. The difference between the intermediate signals V1_p 222 and V1_n 224 is found by the first comparator 232 and the difference is shown as signal (V1_p 222-V1_n 224) 312. When the difference, which is shown as signal 312, is above the threshold 316, the output signal V2_p 236 of the first comparator 232 is a logic high pulse. When the difference, which is shown as the signal 312, is not above the threshold 316, the output signal V2_p 236 of the first comparator 232 is a logic low value. Again, recall that (V1_p 222-V1_n 224) equals (In_p 202-In_n 204). Therefore, when the difference between the differential input voltage signals In_p 202 and In_n 204, or (In_p 202-In_n 204), is above the threshold 316, the output signal V2_p 236 of the first comparator 232 is a logic high pulse.

Similar to the above description, during the time when the difference between the differential input voltage signals In_n 204 and In_p 202, or (In_n 204-In_p 202), is above the threshold 316, the output signal V2_n 238 of the second comparator 234 is a logic high pulse. If the difference between the differential input voltage signals, which is (In_n 204-In_p 202), is not above the threshold 316, then the output signal V2_p 238 of the second comparator 234 is a logic low value. Alternatively, when the difference between the intermediate voltage signals V1_n 224 and V1_p 222, or (V1_n 224-V1_p 222), is above the threshold 316, the output signal V2_p 238 of the second comparator 234 is a logic high pulse. The difference (V1_n 224-V1_p 222) is shown as signal 314 in FIG. 3. Since the input signals In_p 202 and In_n 204 are differential signals, the two comparators 232 and 234 generate an equal number of logic high pulses when the differential amplitude is larger than the threshold 316. The comparator stage 230 may include two comparators to ensure half cycles on the received differential signals are not missed and inadvertently create gaps on a digital translated signal.

The pulse conversion stage 240 receives the signals V2_p 236 and V2_n 238. The pulse conversion stage 240 converts the relatively narrow pulses V2_p 236 and V2_n 238 to a wide continuous pulse without gaps between its rising edge and its falling edge. The output of the pulse conversion stage 240 is shown as V3 242 in both FIG. 2 and FIG. 3. Although a wide continuous pulse for V3 242 is shown with a logic high value denoting the pulse and a logic low value denoting the end of the pulse, a reverse polarity is possible and contemplated.

The continuous pulse V3 242 begins when the first pulse of V2_p 236 begins. The continuous pulse V3 242 ends when the last pulse of V2_n 238 ends. There may be some overlap between the ends since the pulse conversion stage 240 does not wish to end too early and create gaps during the alternating pulses of V2_p 236 and V2_n 238. As shown, the rising edge of the first pulse of V2_p 236 causes the rising edge of the V3 242 pulse, and the falling edge of the last pulse of V2_n 238 causes the falling edge of the V3 242 pulse. If no logic high pulses are generated from the comparator stage, then the pulse conversion stage 240 generates a logic low value. Again, a reverse polarity is possible and contemplated. The signal V3 242 is sent to the digital controller 250, which conveys the signal Out 252. When the signal V3 242 indicates input differential signals In_p 202 and In_n 204 are no longer in an electrical idle state, then the digital controller 250 wakes up other receiver logic, which takes proper action according to an interface specification, such as the high-speed USB 3.0 protocol.

Figure 4:
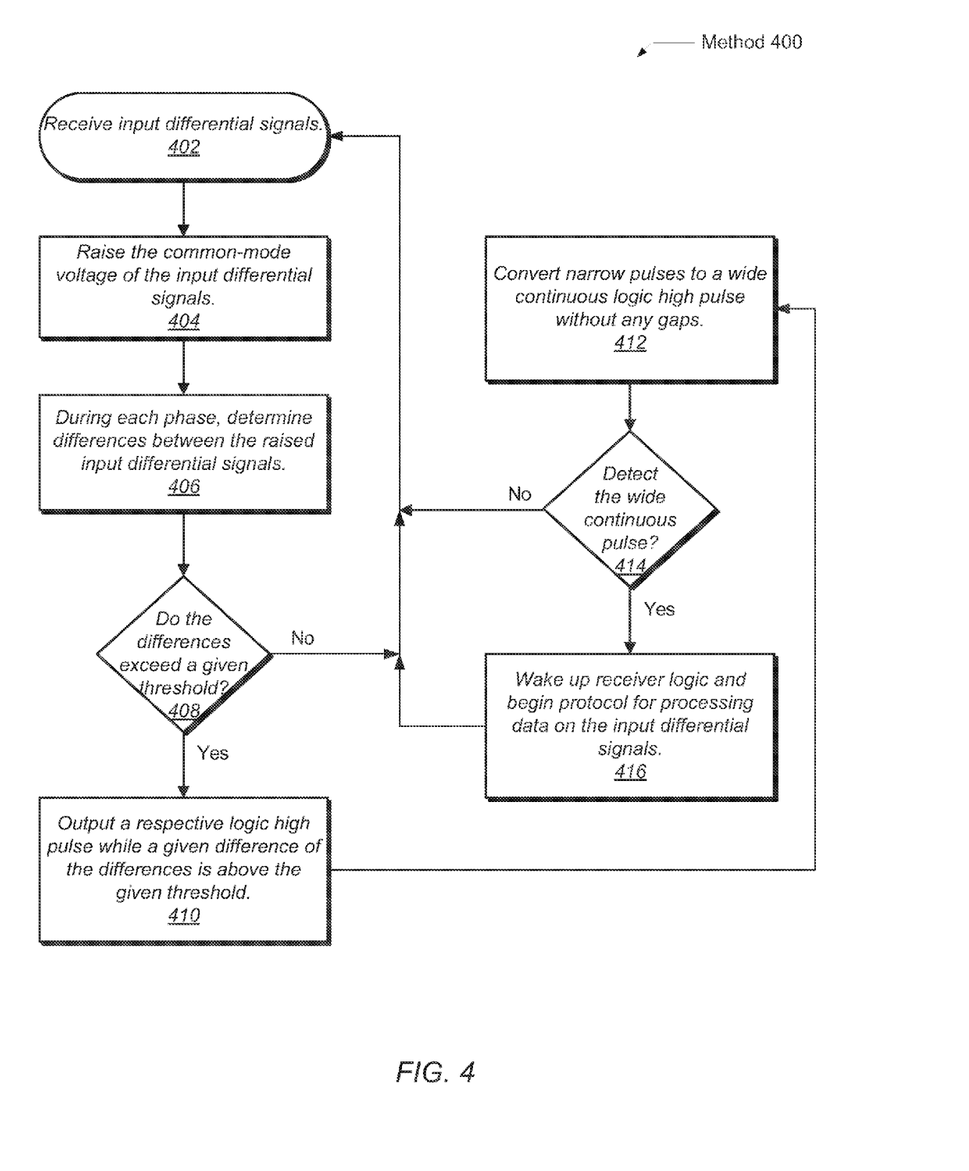
FIG. 4 is a generalized flow diagram of one embodiment of a method for efficiently detecting input differential signals on a communication interface.

Referring now to FIG. 4, one embodiment of a method 400 for efficiently detecting input differential signals on a communication interface is shown. For purposes of discussion, the steps in this embodiment are shown in sequential order. However, in other embodiments some steps may occur in a different order than shown, some steps may be performed concurrently, some steps may be combined with other steps, and some steps may be absent.

In block 402, two input differential signals are received. The two input differential signals may be on data lines for a USB interface. For example, the USB interface may be part of a data communication system utilizing a high-speed USB 3.0 specification. A transmitter may send the two differential signals to a receiver over the data lines. Each of the two input differential signals may be a Low Frequency Periodic Signaling (LFPS) input signal. In block 404, the common-mode voltage of the input differential signals may be raised, increased, or level shifted. Therefore, the peak values of the resulting intermediate signals are greater than the peak values of the original input differential signals. Accordingly, the resulting intermediate signals may more easily drive subsequent logic and circuitry.

In block 406, differences between the above-referenced level shifted intermediate differential signals may be determined for each phase or half cycle. For example, a first difference may be determined between a first intermediate signal and a second intermediate signal. A second difference may be determined with reverse polarity, such as between the second intermediate signal and the first intermediate signal. The two differences may be compared to a given threshold. For example, a built-in threshold voltage of a comparator circuit may be used.

If the two differences each exceed the given threshold (conditional block 408), then in block 410, a respective logic high pulse may be conveyed while a given difference of the two differences is above the given threshold. A first series of pulses may be generated, wherein each pulse in the first series is generated at a given voltage level while the first difference exceeds the given threshold. Referring again to FIG. 3, the first series of pulses V2_p 236 is generated when the first difference (V1_p-V1_n) 312 exceeds the voltage threshold Vthreshold 316. Similarly, a second series of pulses may be generated, wherein each pulse in the second series is generated at a given voltage level while the second difference exceeds the given threshold. Referring again to FIG. 3, the second series of pulses V2_n 238 is generated when the second difference (V1_n-V1_p) 314 exceeds the voltage threshold Vthreshold 316. Here, the given voltage level is the supply voltage. If a reverse polarity is used, the given voltage level may be the ground reference.

In block 412, the narrow pulses generated from the comparisons may be converted to a wide continuous pulse without any gaps. Control logic or circuitry may begin asserting the wide continuous pulse responsive to detecting an initial pulse among the first series of pulses and the second series of pulses. Referring again to FIG. 3, the wide continuous pulse V3 242 begins when the initial pulse for the signal V2_p 236 is detected. Control logic or circuitry may begin asserting the wide continuous pulse responsive to detecting an initial pulse among the first series of pulses and the second series of pulses. Referring again to FIG. 3, the wide continuous pulse V3 242 finishes when the final pulse for the signal V2_n 238 is detected. If the wide continuous pulse is detected (conditional block 414), then in block 416, receiver logic is awakened or receives an indication to exit a sleep mode. Afterward, the receiver logic begins performing a protocol for processing data. The protocol may include the high-speed USB 3.0 specification. The protocol may utilize sideband information received, processed and presented by the input detector circuit.

It is noted that the above-described embodiments may comprise software. In such an embodiment, the program instructions that implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Additionally, program instructions may comprise behavioral-level description or register-transfer level (RTL) descriptions of the hardware functionality in a high level programming language such as C, or a design language (HDL) such as Verilog, VHDL, or database format such as GDS II stream format (GDSII). In some cases the description may be read by a synthesis tool, which may synthesize the description to produce a netlist comprising a list of gates from a synthesis library. The netlist comprises a set of gates, which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. Alternatively, the instructions on the computer accessible storage medium may be the netlist (with or without the synthesis library) or the data set, as desired. Additionally, the instructions may be utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An input detector circuit comprising:
   a level shift stage configured to:
      receive a first differential signal and a second differential signal; and
      generate a first intermediate signal and a second intermediate signal by raising a common-mode voltage for each of the first differential signal and the second differential signal such that a voltage difference between the first intermediate signal and the second intermediate signal is equal to a voltage difference between the first differential signal and the second differential signal; and a comparator stage coupled to the level shift stage, wherein the comparator stage is configured to:
generate a first series of pulses responsive to determining a first voltage difference between the second intermediate signal and the first intermediate signal exceeds a given threshold;
generate a second series of pulses responsive to determining a second voltage difference between the first differential signal and the second differential signal exceeds the given threshold; and
circuitry configured to detect an end of an electrical idle state based at least in part on the first series of pulses and the second series of pulses.

2. The input detector circuit as recited in claim 1, wherein each of the first differential signal and the second differential signal is a Low Frequency Periodic Signaling (LFPS) input signal.

3. The input detector circuit as recited in claim 1, wherein the level shift stage couples each of the first differential signal and the second differential signal only to a respective single pmos transistor gate terminal.

4. The input detector circuit as recited in claim 1, wherein the given threshold is a built-in threshold of a comparator used within the comparator stage.

5. The input detector circuit as recited in claim 1, further comprising a pulse conversion stage coupled to the comparator stage, wherein the pulse conversion stage is configured to begin asserting a continuous pulse responsive to detecting an initial pulse among the first series of pulses and the second series of pulses.

6. The input detector circuit as recited in claim 5, wherein the pulse conversion stage is further configured to deassert the continuous pulse responsive to detecting a final pulse among the first series of pulses and the second series of pulses.

7. The input detector circuit as recited in claim 6, further comprising a digital controller stage coupled to the pulse conversion stage, wherein the digital controller stage is configured to generate an indication to exit a sleep mode and perform a data communications protocol while detecting the continuous pulse is asserted.

8. The input detector circuit as recited in claim 7, wherein the data communications protocol is a Universal Serial Bus (USB) interface protocol.

9. A method for execution by circuitry in a computer system, the method comprising:
receiving a first differential signal and a second differential signal at a level shift stage;
generating a first intermediate signal and a second intermediate signal by raising a common-mode voltage for each of the first differential signal and the second differential signal such that a voltage difference between the first intermediate signal and the second intermediate signal is equal to a voltage difference between the first differential signal and the second differential signal;
sending the first intermediate signal and the second intermediate signal from the level shift stage to a comparator stage;
generating a first series of pulses responsive to determining a first voltage difference between the second intermediate signal and the first intermediate signal exceeds a given threshold;
generating a second series of pulses responsive to determining a second voltage difference between the first differential signal and the second differential signal exceeds the given threshold; and
detecting an end of an electrical idle state based at least in part on the first series of pulses and the second series of pulses.

10. The method as recited in claim 9, wherein each of the first differential signal and the second differential signal is a Low Frequency Periodic Signaling (LFPS) input signal.

11. The method as recited in claim 9, further comprising coupling each of the first differential signal and the second differential signal only to a respective single pmos transistor gate terminal.

12. The method as recited in claim 9, wherein the given threshold is a built-in threshold of a comparator used within the comparator stage.

13. The method as recited in claim 9, further comprising asserting a continuous pulse responsive to detecting an initial pulse among the first series of pulses and the second series of pulses.

14. The method as recited in claim 13, further comprising deasserting the continuous pulse responsive to detecting a final pulse among the first series of pulses and the second series of pulses.

15. The method as recited in claim 14, further comprising indicating to circuitry to exit a sleep mode and perform a data communications protocol while detecting the continuous pulse is asserted.

16. The method as recited in claim 15, wherein the circuitry is within a separate relative high-speed, high-bandwidth receiver.

17. A bus communication system comprising:
a transmitter configured to generate a first differential signal and a second differential signal, each with a predetermined common-mode (CM) voltage level;
a bus comprising at least two data lines coupling the transmitter to a receiver;
a receiver configured to:
receive the first differential signal and the second differential signal;
generate a first intermediate signal and a second intermediate signal by raising the CM voltage for each of the first differential signal and the second differential signal such that a voltage difference between the first intermediate signal and the second intermediate signal is equal to a voltage difference between the first differential signal and the second differential signal;
generate a first series of pulses responsive to determining a first voltage difference between the second intermediate signal and the first intermediate signal exceeds a given threshold;
generate a second series of pulses responsive to determining a second voltage difference between the first differential signal and the second differential signal exceeds the given threshold; and
detect an end of an electrical idle state based at least in part on the first series of pulses and the second series of pulses.

18. The bus communication system as recited in claim 17, wherein each of the first differential signal and the second differential signal is a Low Frequency Periodic Signaling (LFPS) input signal.

19. The bus communication system as recited in claim 17, wherein the given threshold is a built-in threshold of a comparator used within the comparator stage.

20. The bus communication system as recited in claim 19, wherein the receiver is further configured to:
assert a continuous pulse responsive to detecting an initial pulse among the first series of pulses and the second series of pulses; and deassert the continuous pulse responsive to detecting a final pulse among the first series of pulses and the second series of pulses.

\* \* \* \* \*